United States Patent
Seppäläet al.

(12) 
(10) Patent No.: US 6,867,579 B2
(45) Date of Patent: *Mar. 15, 2005

(54) TESTING SYSTEM IN A CIRCUIT BOARD MANUFACTURING LINE FOR AUTOMATIC TESTING OF CIRCUIT BOARDS

(75) Inventors: Hannu Seppälä, Salo (FI); Pekka Kurppa, Salo (FI); Jarmo Teeri, Salo (FI)

(73) Assignee: PMJ Automec Oyj, Virkkala (FI)

( * ) Notice: Subject to any disclaimer, the term of this patent is extended or adjusted under 35 U.S.C. 154(b) by 42 days.

This patent is subject to a terminal disclaimer.

(21) Appl. No.: 10/381,072

(22) PCT Filed: Sep. 21, 2001

(86) PCT No.: PCT/FI01/00828

§ 371 (c)(1),
(2), (4) Date: Mar. 19, 2003

(87) PCT Pub. No.: WO02/25300

PCT Pub. Date: Mar. 28, 2002

(65) Prior Publication Data

US 2003/0184281 A1 Oct. 2, 2003

(30) Foreign Application Priority Data

Sep. 21, 2000 (FI) .............................. 20002086

(51) Int. Cl.⁷ ................................................ G01R 1/04
(52) U.S. Cl. .................................................. 324/158.1
(58) Field of Search ............................ 324/158.1, 537; 198/409, 411, 413–414

(56) References Cited

U.S. PATENT DOCUMENTS

| | | | |
|---|---|---|---|
| 4,845,843 A | | 7/1989 | Babcock |
| 5,009,306 A | * | 4/1991 | Roderick et al. ............ 198/414 |
| 5,093,984 A | * | 3/1992 | Lape ........................... 324/537 |
| 5,184,068 A | | 2/1993 | Twigg et al. |
| 5,680,936 A | | 10/1997 | Beers |
| 5,848,705 A | * | 12/1998 | Gianpaolo et al. ........ 324/158.1 |
| 6,145,191 A | * | 11/2000 | Baldwin ....................... 29/840 |
| 6,232,766 B1 | | 5/2001 | Saouli et al. |
| 6,378,690 B1 | * | 4/2002 | Pessina et al. ............... 198/414 |
| 6,614,220 B2 | * | 9/2003 | Mang et al. .............. 324/158.1 |

FOREIGN PATENT DOCUMENTS

| | | |
|---|---|---|
| DE | 44 16 755 | 11/1995 |
| GB | 2229540 | 9/1990 |
| JP | 1-259271 | 10/1989 |
| JP | 9-89960 | 4/1997 |

* cited by examiner

Primary Examiner—David Zarneke
Assistant Examiner—Jermele Hollington
(74) Attorney, Agent, or Firm—Merchant & Gould P.C.

(57) ABSTRACT

Testing system for automatic testing of circuit boards (1) in a circuit board manufacturing line. The system comprises a set of test modules (4) comprising a testing apparatus, each test module comprising a horizontal module conveyor (5) for moving a circuit board (1) into and out of the test module, which test modules are arranged into a superposed relation with respect to each other. A feed device (6) has been fitted to receive and arrange a number of circuit boards from a first line conveyor (3) into a superposed relation with respect to each other so that the circuit boards (1) lie at a distance from each other corresponding to the distance between the module conveyors (5) and to feed the circuit boards substantially simultaneously into the test modules (4).

17 Claims, 7 Drawing Sheets

Figure 1:
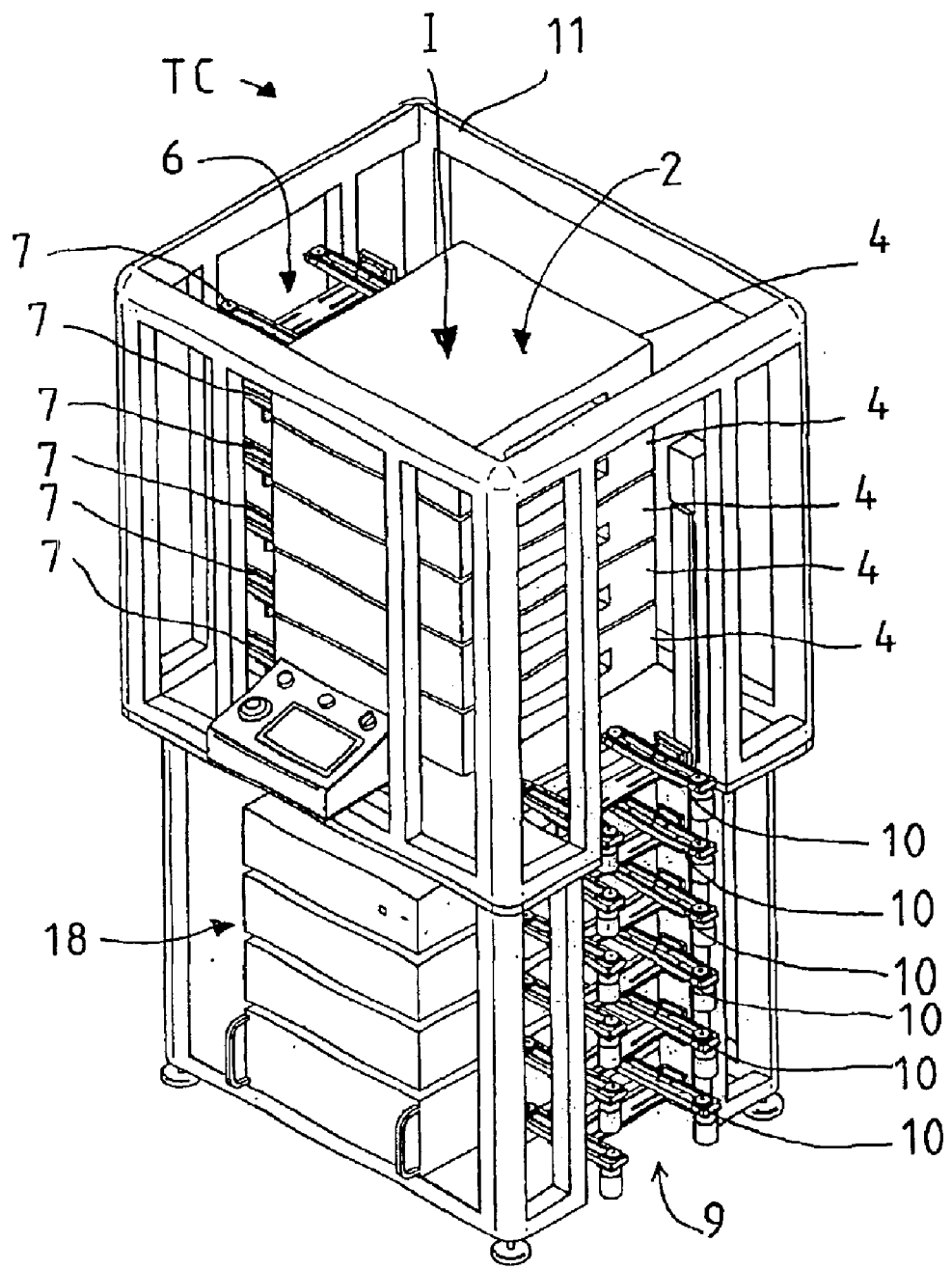

TESTING SYSTEM IN A CIRCUIT BOARD MANUFACTURING LINE FOR AUTOMATIC TESTING OF CIRCUIT BOARDS

FIELD OF THE INVENTION

The present invention relates to a testing system as defined in the preamble of claim 1.

BACKGROUND OF THE INVENTION

The invention relates to so-called inline testing performed in connection with a circuit board manufacturing line. On the manufacturing line, components are set and soldered on a circuit board, whereupon a testing system tests the circuit board and components in accordance with a set of predetermined instructions, such as a computer program, to determine their electric operation. The manufacturing line comprises a line conveyor which conveys the circuit boards horizontally in succession as a file to a testing apparatus. A conveyor comprised in the testing system conveys the circuit board into a testing station, a positioning device stops it at the proper position and contacting means comprised in a testing device establish an electric contact with the circuit board, whereupon the testing apparatus automatically carries out the required testing operations on the circuit board. After the test, the circuit board is removed from the testing apparatus and allowed to move further on the manufacturing line.

In prior art, a testing system is known in which a number of testing apparatus are disposed side by side or one after the other on the same level with the line conveyor. A problem with a system like this is that the adjacent testing apparatuses disadvantageously increase the length of the production line in confined industrial facilities. In addition, the circuit boards need to be conveyed through long distances, which means that expensive production time is spent on conveying the circuit boards and the testing may become a bottleneck in the production process.

The object of the invention is to eliminate the above-mentioned disadvantages.

A specific object of the invention is to disclose a system that is as compact as possible and occupies a small proportion of the length of the production line.

A further object of the invention is to disclose a system in which the distances over which the circuit boards have to be conveyed are as short as possible and the conveying requires as little time as possible, and that the total time spent on conveying and testing is as short as possible so that the testing will not constitute any bottleneck in the production.

The system of the invention is characterized by what is presented in claim 1.

BRIEF DESCRIPTION OF THE INVENTION

According to the invention, the system comprises a set of test modules comprising a testing apparatus, each one of said test modules comprising a horizontal module conveyor for conveying a circuit board into and out of the test module, said test modules being arranged in a superposed relation with respect to each other. Further, the system comprises a feed device fitted to receive and arrange a number of circuit boards from a first line conveyor into a superposed relation with respect to each other so that the circuit boards lie at a distance from each other corresponding to the distance between the module conveyors and to feed the circuit boards substantially simultaneously into the test modules.

The invention has the advantage that the system only occupies a small proportion of the line length and has a good testing capacity and that the testing does not form a bottleneck in the production of circuit boards.

In an embodiment of the system, the manufacturing line comprises a second line conveyor, whose conveying direction is the same as the conveying direction of the first line conveyor and which, as seen in the conveying direction, is disposed after the testing apparatus to receive the circuit boards from the testing apparatus and to convey them horizontally in succession as a file. The system further comprises a receiving device disposed on the opposite side of the test modules in relation to the feed device. The receiving device is fitted to receive from the test modules a number of circuit boards simultaneously in a superposed relation with respect to each other so that the circuit boards lie at a distance from each other corresponding to the distance between the module conveyors and to pass on the circuit boards onto the second line conveyor so that they form a successive file on it.

In an embodiment of the system, the feed device is a feed elevator moving in a vertical direction and comprising a number of horizontal first elevator plane conveyors disposed one above the other at a distance from each other corresponding to the distance between the module conveyors.

In an embodiment of the system, the feed elevator is fitted to move the first elevator plane conveyors vertically in successive order so as to bring them into alignment with the first line conveyor to receive one circuit board at a time from the first line conveyor onto each first elevator plane conveyor, to move the first elevator plane conveyors simultaneously so as to bring them into alignment with the module conveyors and to feed the circuit boards simultaneously from the first elevator plane conveyors onto the module conveyors in preparation for simultaneous testing to be carried out in the testing apparatus.

In an embodiment of the system, the receiving device is a vertically movable receiving elevator comprising a number of horizontal second elevator plane conveyors disposed one above the other at a distance from each other corresponding to the distance between the module conveyors.

In an embodiment of the system, the receiving elevator has been fitted to receive the circuit boards simultaneously from the module conveyors, to bring the second elevator plane conveyors in successive order into alignment with the second line conveyor to permit the circuit boards to be moved one at a time from each second elevator plane conveyor and placed on the second line conveyor so that they form a successive file on it.

In an embodiment of the system, the system comprises a second set of test modules comprising a testing apparatus and disposed beside the first set of test modules to perform a test on the circuit boards which is different from the test performed by the test modules of the first set.

In an embodiment of the system, each test module in the second set comprises a horizontal module conveyor for moving a circuit board into and out of the test module. The test modules of the second set are disposed in a superposed relation to each other and adjacently to the test modules of the first set so that their module conveyors are in alignment with each other in immediate vicinity of each other. The module conveyors are so controlled that the circuit boards are moved simultaneously from the module conveyors of the test modules of the first set onto the module conveyors of the test modules of the second set.

In an embodiment of the system, the circuit boards conveyed on the circuit board manufacturing line are mutually identical. The test modules in one test module set are mutually identical, performing an identical test on all circuit boards.

In an embodiment of the system, the circuit boards conveyed on the circuit board manufacturing line include different circuit board types requiring different testing. The same set comprises test modules designed to carry out different tests on the circuit boards in accordance with the circuit board type.

In an embodiment of the system, the feed device, the test modules and the receiving device have been assembled into a single unit built in a common mounting frame to form a testing cell which can be incorporated in a modular manufacturing line consisting of different cells.

In an embodiment of the system, the mounting frame comprises guide supporters placed at a vertical distance from each other to support the test modules one above the other and allowing the test module supported by said guide supporters to be removed from and inserted into the mounting frame by a horizontal movement.

In an embodiment of the system, the test module comprises a cassette-like frame box inside which the module conveyor and the testing apparatus are mounted, said frame box comprising a back wall provided with rear connectors for the supply of electricity or the like and/or for the transmission of control data. The mounting frame is provided with counter-connectors so fitted that the rear connectors and the counter-connectors are coupled when the test module is being mounted in the mounting frame.

In an embodiment of the system, the test modules are disposed above the level of the line conveyors.

In an embodiment of the system, the system comprises a horizontal transit conveyor disposed below the lowest one of the test modules in the test module set, in alignment with the line conveyor, for conveying circuit boards through the testing system without having them tested.

In an embodiment of the system, the mounting frame comprises a control gear space disposed below the test modules to accommodate the control devices used to control the test modules and the feeding and receiving elevators.

In an embodiment of the system, the feed elevator and/or the receiving elevator comprises a vertical guide rail fixed to the mounting frame; a hoisting slide arranged to be movable along the guide rail, the elevator plane conveyors being connected to said hoisting slide one above the other at a fixed distance from each other; and a positioning actuator for moving and positioning the hoisting slide. The positioning actuator may consist of e.g. a pneumatic linear drive unit, a servo motor-operated screw, such as a ball screw, or a linear stepping motor. The positioning actuator may also consist of any other servo-controlled actuator having a sufficient positioning accuracy and speed of movement.

LIST OF ILLUSTRATIONS

Figure 2:
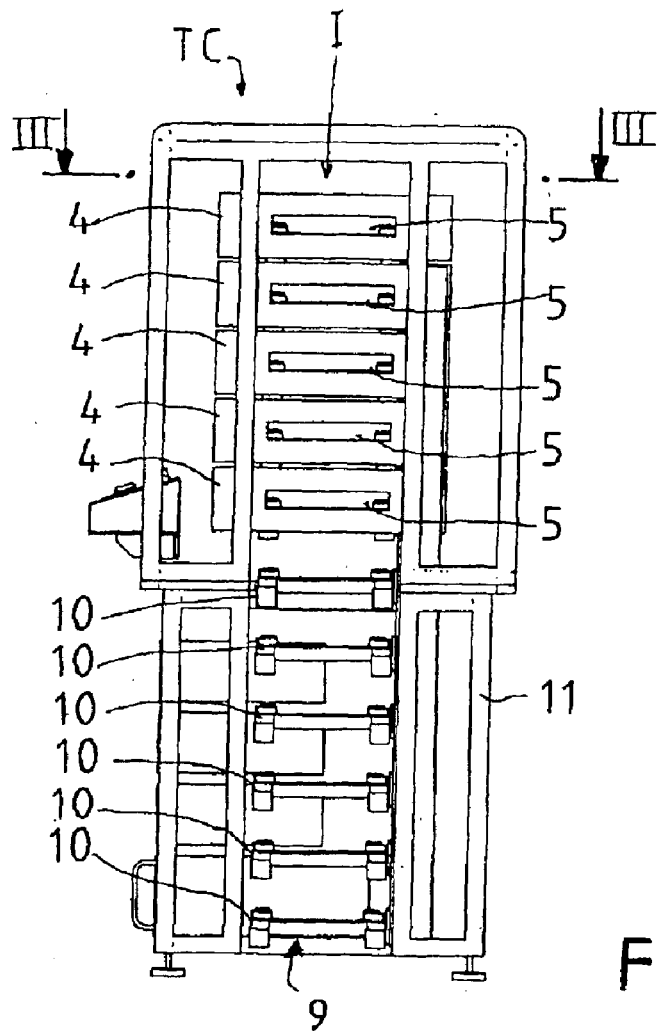
Figure 3:
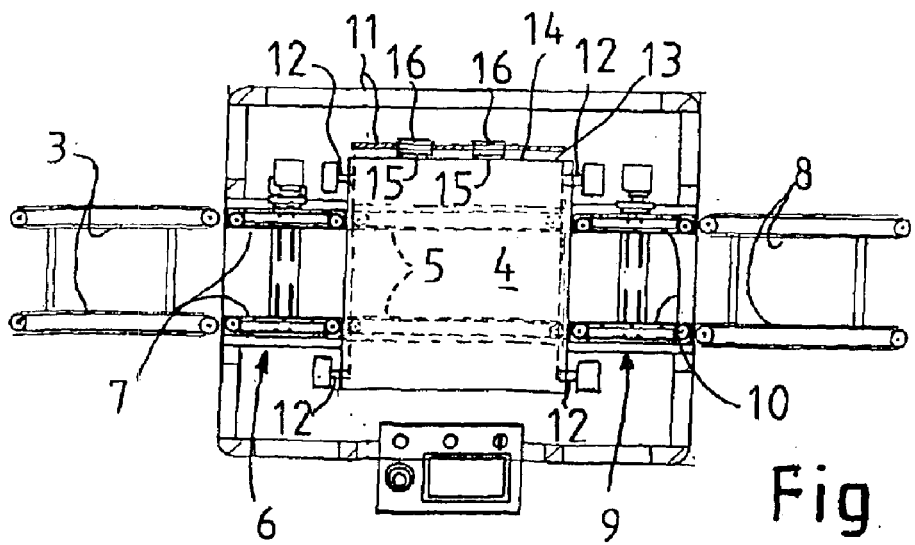
Figure 4:
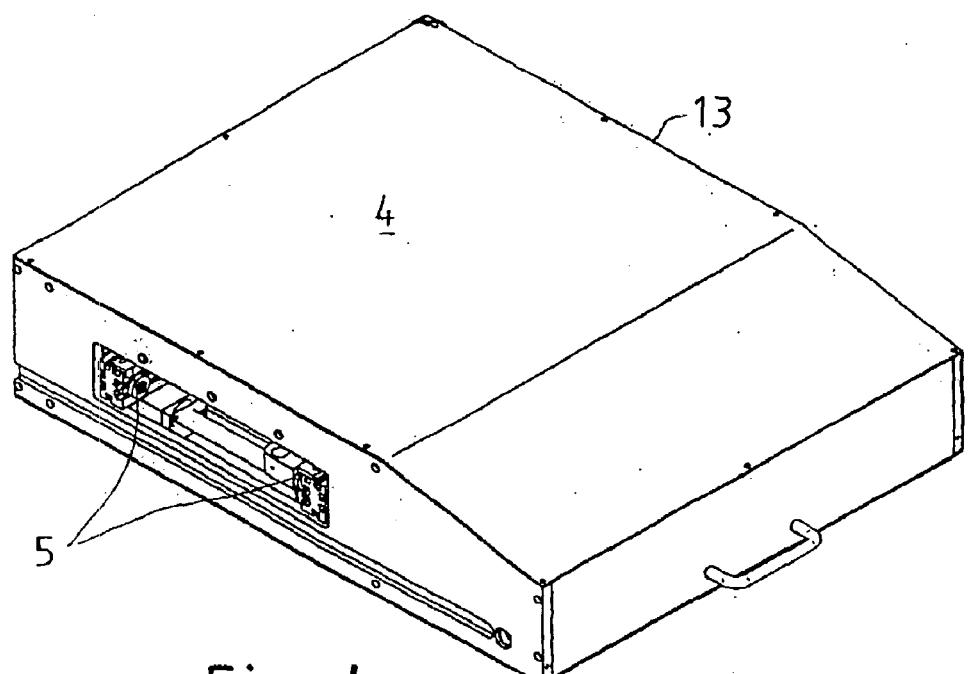
Figure 5:
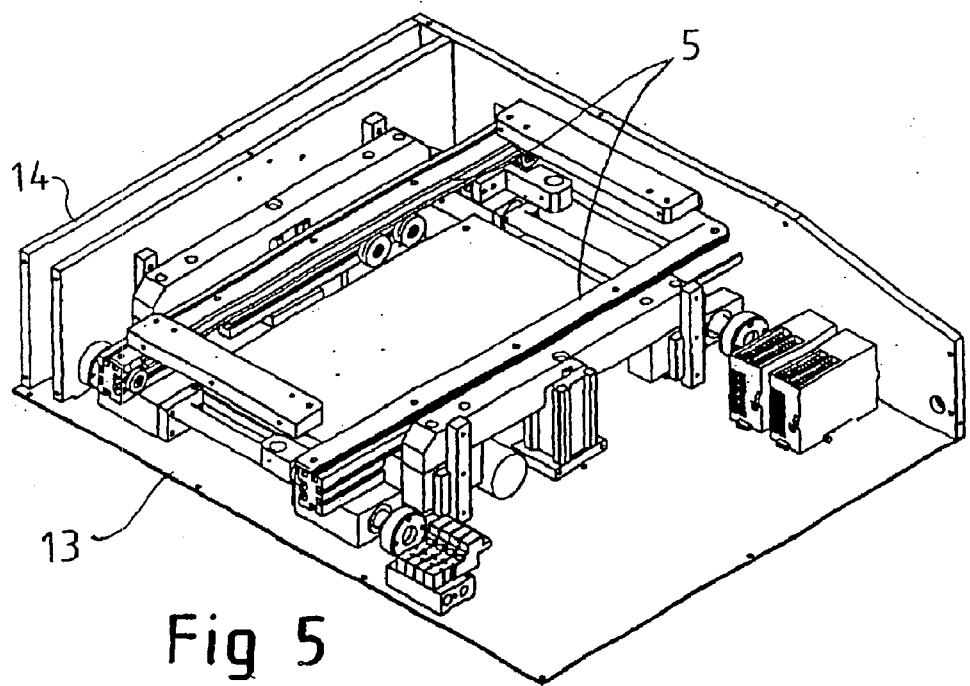
Figure 6:
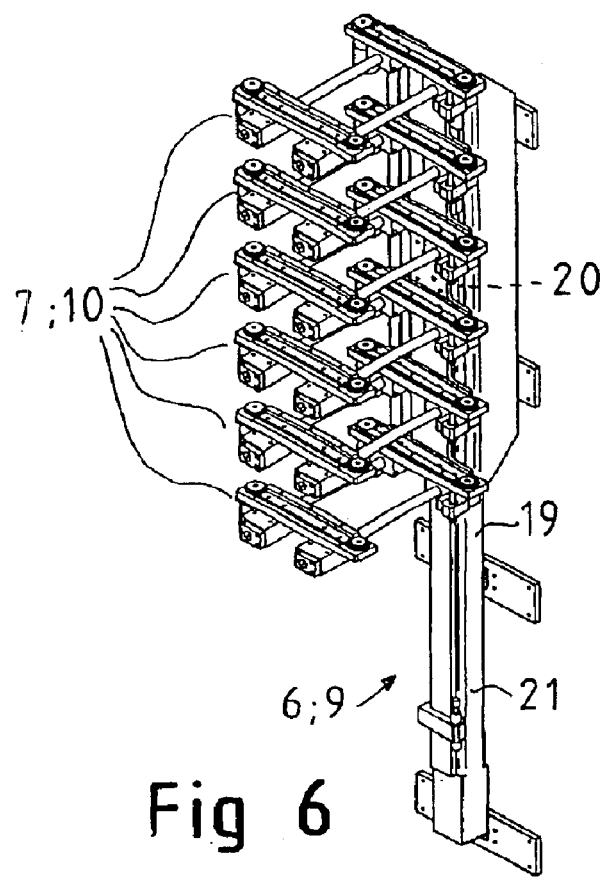
Figure 7:
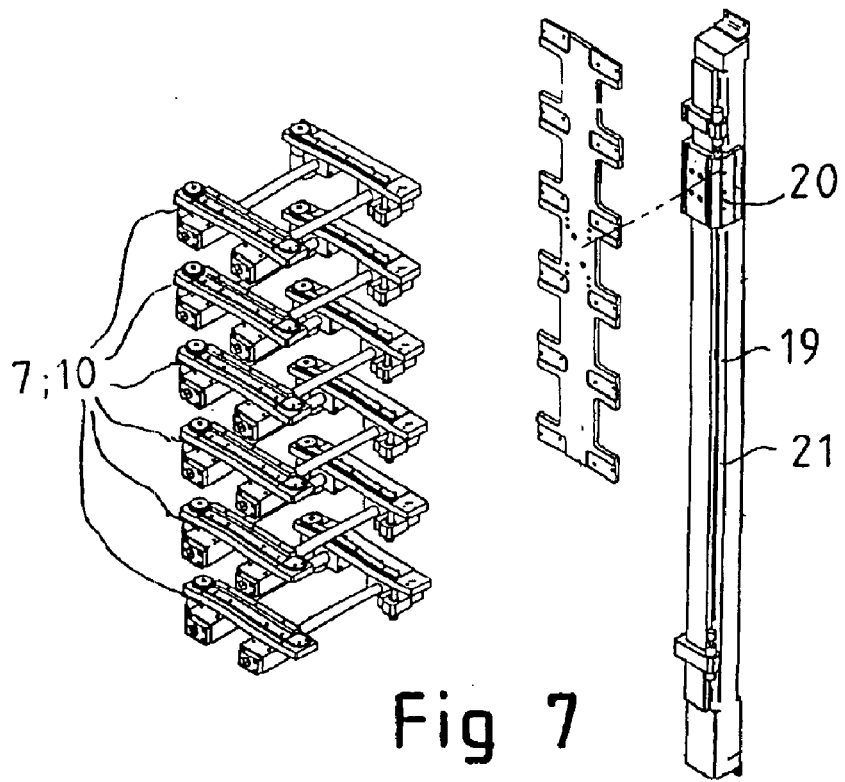
Figure 12:
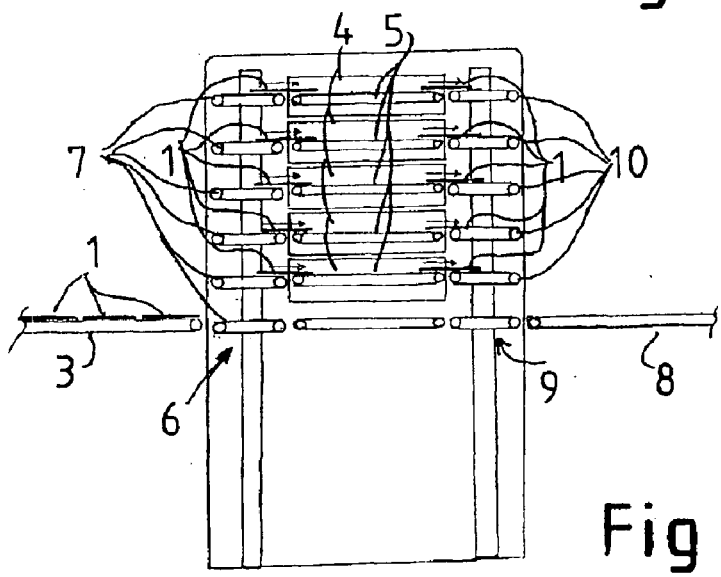
Figure 13:
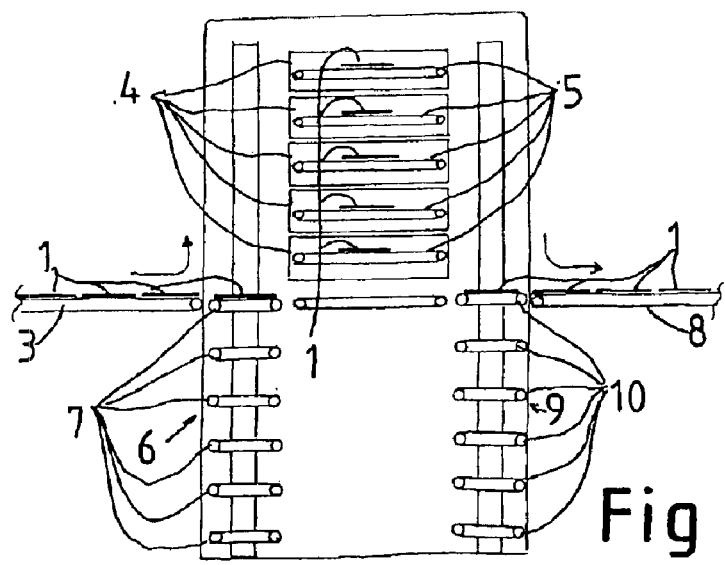
Figure 14:
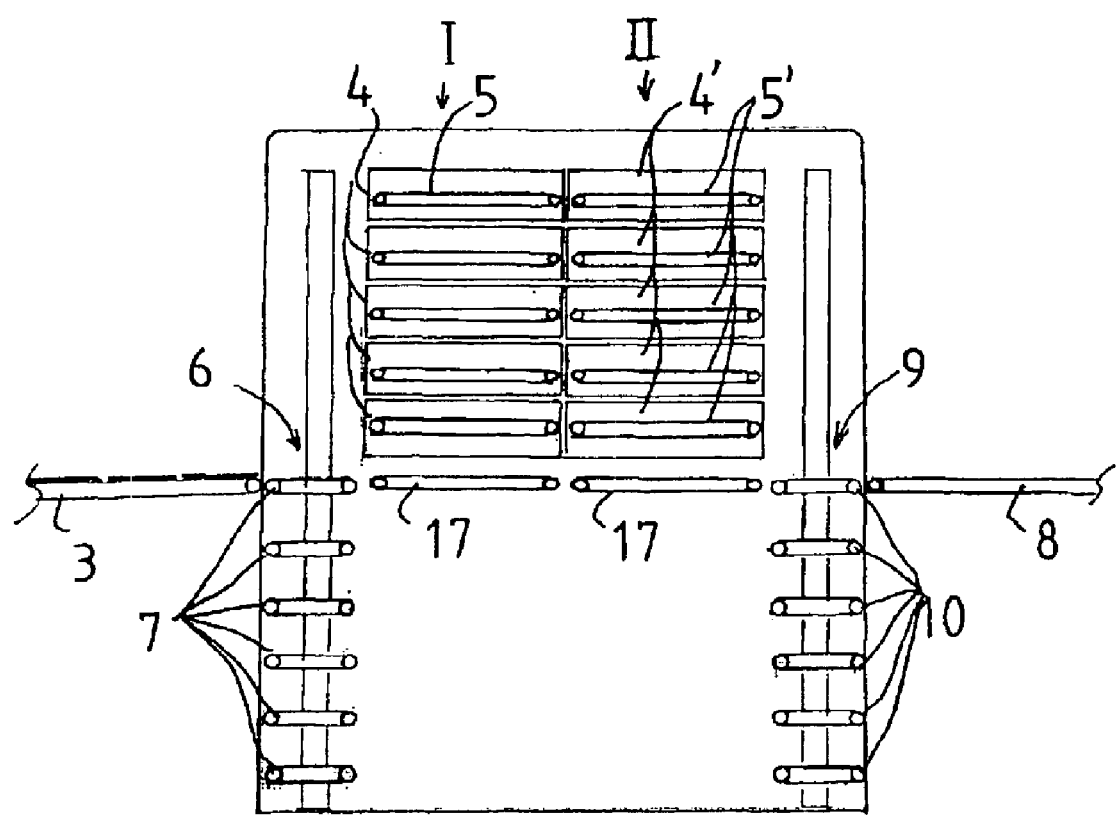

In the following, the invention will be described in detail by the aid of examples of its embodiments with reference to the attached drawings, wherein FIG. 1 presents an axonometric oblique top view of a testing cell according to an embodiment of the system of the invention, FIG. 2 presents a lateral view of the testing cell of FIG. 1, FIG. 3 presents a section III—III through the testing cell of FIG. 2, FIGS. 4 and 5 present a test module according to an embodiment of the system of the invention in an axonometric oblique top view, FIG. 6 presents a feed elevator or receiving elevator according to an embodiment of the system of the invention in an axonometric oblique top view, FIG. 7 presents the elevator of FIG. 6 in a partially exploded view, FIGS. 8–13 present diagrammatic lateral views of the testing cell according to an embodiment of the system of the invention, illustrating the principle of its operation at different stages, and FIG. 14 presents a skeleton diagram of a testing cell according to another embodiment of the system of the invention in lateral view.

DETAILED DESCRIPTION OF THE INVENTION

FIGS. 1–3 present a testing cell TC which can be installed as a modular part in a circuit board manufacturing line, designed for automatic testing of circuit boards with components mounted on them. FIG. 3 illustrates the placement of the testing cell TC in the production line so that on both sides of the testing cell TC there is a line conveyor, a first line conveyor 3, which is placed before the testing-cell, i.e. on the supply side of it with respect to the conveying direction of the line, and a second line conveyor 8, which is placed after the testing cell TC, i.e. on its receiving side with respect to the conveying direction of the line.

The starting point in the design of the testing cell TC has been that the length of the testing cell in the direction of the production line should be as small as possible while the cell has a large testing capacity. Thus, the testing cell TC described in the example has a length of only about 1 meter in the direction of the line.

The testing cell TC comprises a set of test modules 4, each comprising a testing apparatus. In the examples presented here, the number of test modules is five, but it is to be noted that the number of test modules 4 may be higher or lower than that. The number of test modules is not limited in any way because it does not change the length of the testing cell in the longitudinal direction of the production line. There is usually always enough room in the vertical dimension in manufacturing plants.

Mounted inside each test module 4, of which an example is shown in FIGS. 4 and 5, is a horizontal module conveyor 5. The module conveyor 5 is a conventional circuit board conveyor which supports the circuit board by its opposite side edges. The module conveyor 5 can be adapted to accommodate circuit boards of different widths by adjusting the distance between the two halves of the conveyor. The module conveyor 5 moves the circuit board into a testing position in the test module 4, where it can be brought into the proper position in a conventional manner so as to allow an electric contact to be established by contacting means and the testing operations to be carried out. The module conveyor 5 receives the circuit board from the supply side A and removes it from the test module to the opposite or exit side B. In relation to each other, the test modules 4 of set I are arranged one above the other. The conveying directions of the module conveyors 5 of all test modules 4 are the same as the conveying direction of the line. The line conveyors 3 and 8 are plane conveyors which convey the circuit boards in a horizontal plane in succession as a file.

All the circuit boards 1 conveyed in succession on the circuit board manufacturing line are usually of a uniform design. Therefore, all the test modules 4 in the testing cell are identical to each other, performing an identical test on all circuit boards. It is also possible that there are circuit board types requiring different testing among the circuit boards 1 conveyed on the circuit board manufacturing line. In that case, the set of test modules in the testing cell may comprise test modules differing from each other, performing different tests corresponding to different circuit board types.

Further, the testing cell TC comprises a feed elevator 6 located between the first line conveyor 3 and the test modules 4. The function of the feed elevator 6 is to collect from the first line conveyor 3 the circuit boards conveyed in succession and to array them into a superposed relation to each other so that they can be passed onto the module conveyors 5 of the test modules 4 placed one above the other.

The feed elevator 6 comprises a number of horizontal first elevator plane conveyors 7, the number of which is six in this example. The number of elevator plane conveyors is at least equal to the number of superposed test modules. The elevator plane conveyor 7 is a conventional circuit board conveyor which supports the circuit board by its opposite side edges. The elevator plane conveyor 7 can be adapted so as to enable it to convey circuit boards of different widths by adjusting the distance between its two halves. The elevator plane conveyors 7 are disposed one above the other, spaced by a distance corresponding to the distance between the module conveyors 5. The conveying direction of the first elevator plane conveyors 7 is the same as the general conveying direction of the line. The feed elevator 6 has been arranged to move the first elevator plane conveyors 7 vertically in successive order so as to bring each one of them into alignment with the first line conveyor 3 to allow one circuit board at a time to be received from the first line conveyor 3 onto each first elevator plane conveyor 7. Further, the feed elevator 6 has been arranged to move the first elevator plane conveyors 7 simultaneously so as to bring them into alignment with the module conveyors 5, and to pass the circuit boards simultaneously from the first elevator plane conveyors 7 onto the module conveyors 5 in preparation for a test to be performed simultaneously in all test modules 4.

The testing cell TC is also provided with a receiving elevator 9 disposed on the exit side B of the test module set I, i.e. between set I and the second line conveyor 8. The function of the receiving elevator 9 is contrary to that of the feed elevator 6, in other words, the receiving elevator 9 receives the circuit boards arranged in a superposed relation to each other from the module conveyors 5 of the test modules 4 and delivers them onto the second line conveyor 8 so that they form a successive file on it.

The structure of the receiving elevator 9 is identical to that of the feed elevator 6. The receiving elevator 9 comprises a number of horizontal second elevator plane conveyors 10, the number of which is six in this example. Their number is preferably at least equal to the number of superposed test modules. The elevator plane conveyor 10 is a conventional circuit board conveyor which supports the circuit board by its opposite side edges. The module conveyor 10 can be adapted to accommodate circuit boards of different widths by adjusting the distance between the two halves of the conveyor. The second elevator plane conveyors 10 are disposed one above the other, spaced by a distance corresponding to the distance between the module conveyors 5. The conveying direction of the second elevator plane conveyors 10 is the same as the conveying direction of the line conveyors 3, 8. The receiving elevator 8 has been arranged to receive the circuit boards simultaneously from the module conveyors 5, to bring the second elevator plane conveyors 9 in successive order into alignment with the second line conveyor 8 so as to allow the circuit boards to be passed one at a time from each second elevator plane conveyor 10 onto the second line conveyor 8 so that they form a successive file on it.

In the testing cell TC, the feed elevator 6, the test modules 4 and the receiving elevator 9 have been put together as a unitary assembly built into a common rack-like mounting frame 11. As can be seen from FIG. 3, the mounting frame 11 comprises guide supporters 12 disposed at a vertical distance from each other to support the test modules 4 one above the other. Supported by the guide supporters 12, the test module 4 can be removed from the mounting frame 11 and inserted into position by a horizontal movement. As is further shown in FIGS. 1–3, in the testing cell TC the test modules 4 are disposed above the level of the line conveyors 3, 8. Mounted on the mounting frame 11 below the lowest one of the test modules in the test module set is additionally a horizontal transit conveyor 17 (see FIGS. 8–14), arranged to be in alignment with the line conveyors 3, 8. By means of the transit conveyor 17 and elevator plane conveyors 7 and 109, circuit boards can be conveyed directly through the testing system when no testing is to be performed on them in the test modules 4. Below the transit conveyor 17 there is a control gear space 18 accommodating control equipment needed to control the test modules 4 and the feed elevators 6 and receiving elevators 9 etc.

FIGS. 4 and 5 present one test module 4. The test module 4 comprises a cassette-like frame box 13 with a module conveyor 5, a positioning and aligning device and contacting means together with their actuators mounted inside it. The box 13 is provided with openings placed in the region of the opposite ends of the module conveyors 5.

As shown in FIG. 3, the frame box 13 of the test module 4 comprises a back wall 14 provided with rear connectors 15 for the supply of electricity to the test module 4 and for the transfer of control data, among other things. The mounting frame 11 is provided with counter-connectors 16 which are so fitted that the rear connectors 15 and the counter-connectors 16 are connected together when the test module 4 is being mounted on the mounting frame 11.

FIGS. 6 and 7 illustrate the structure of the feed elevator 6 and/or receiving elevator 9. Fixed to the mounting frame 11 is a vertical guide rail 19. A hoisting slide 20 is mounted on the vertical guide rail 19 so that it can move along the guide rail. Attached to the hoisting slide 20 are elevator plane conveyors 7 or 10 at a fixed distance from each other. A positioning actuator 21 moves the hoisting slide 20 and the elevator plane conveyors attached to it and positions them accurately in a predetermined manner. In the example embodiment illustrated in the drawings, the positioning actuator 21 is a pneumatic linear drive unit (e.g. Festo Type DGPIL), whose conveying speed and about 0.1 mm positioning accuracy are sufficient for the purpose. The positioning actuators 21 used may alternatively consist of any other known servo-controlled actuators, such as a servo-motor driven ball screw transmission, a linear stepping motor or the like.

Figure 8:
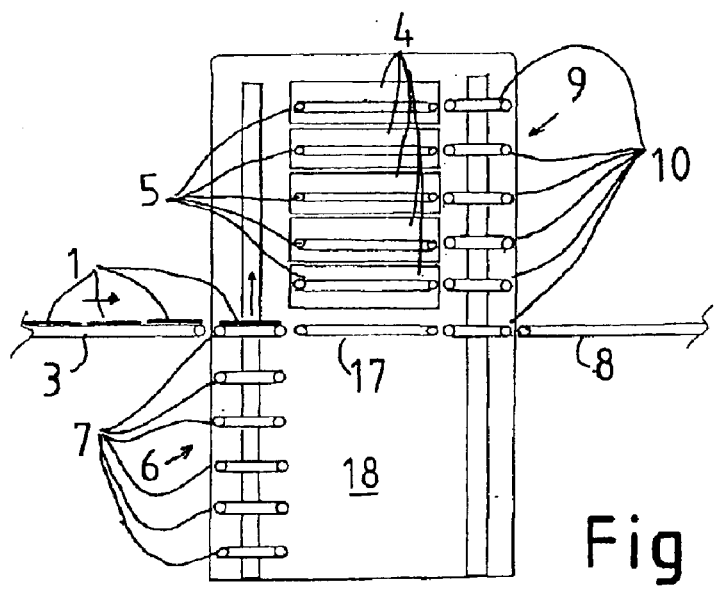
Figure 9:
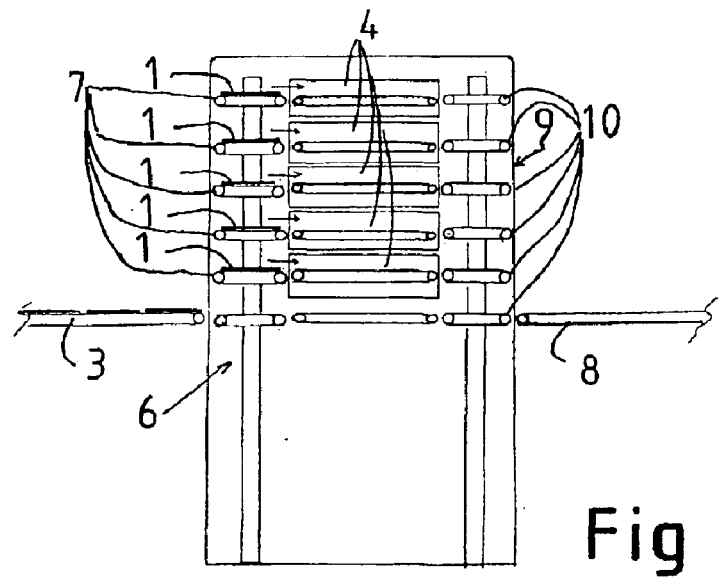
Figure 10:
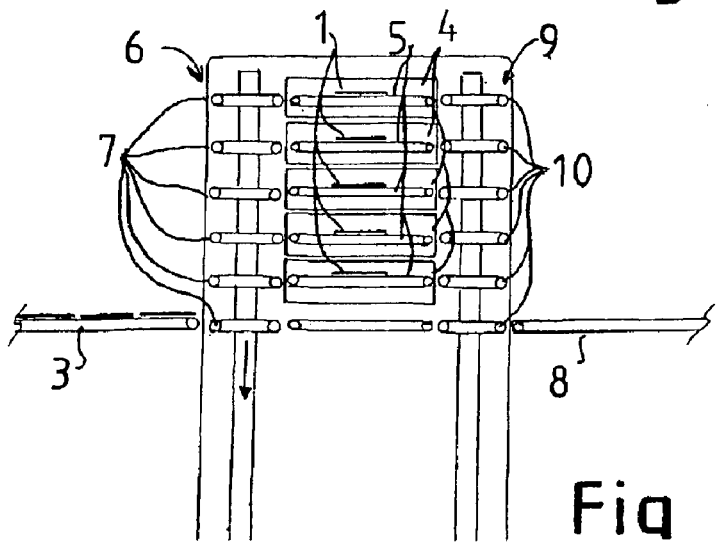

FIGS. 8–10 illustrate the operation of the testing cell.

In FIG. 8, the feed elevator 8 is down in its extreme position where its topmost first elevator plane conveyor 7 is at the level of the first line conveyor 3, and the first circuit board 1 has just moved onto it from the first line conveyor. The feed elevator 6 brings each elevator plane conveyor 7 in turn to the level of the first line conveyor 3, from which the elevator plane conveyors receive the circuit boards 1, one circuit board being placed on each elevator plane conveyor.

In FIG. 9, the five topmost elevator plane conveyors 7 carry one circuit board 1 each. The feed elevator 6 has been so positioned that the elevator plane conveyors 7 are in alignment with the module conveyors 5 of the test modules 4, so that all five circuit boards 1 can be moved simultaneously onto the module conveyors 5 of five test modules 4.

In FIG. 10, the circuit boards 1 are on the module conveyors 5 and positioned for testing. The feed elevator 6 descends back to the low position shown in FIG. 8 to fetch the next batch of circuit boards to be fed into the test modules 4.

Figure 11:
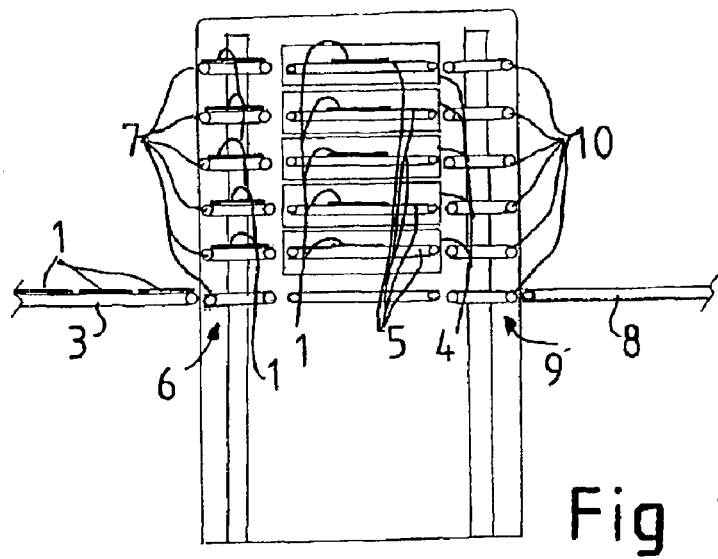

In FIG. 11, the feed elevator 6 has got a new batch of five circuit boards 1 ready to be fed into the test modules 4. The receiving elevator 9 has been positioned in its high position so that the five topmost ones of the second elevator plane conveyors 10 are in alignment with the module conveyors 5 of the test modules 4.

In FIG. 12, after the testing of the first batch of five circuit boards 1 has been completed, these circuit boards are moved simultaneously onto the second elevator plane conveyors 10 of the receiving elevator 9. At the same time, the first elevator plane conveyors 7 of the feed elevator 6 feed the new batch of five circuit boards which has been waiting onto the module conveyors 5 of the test modules 4.

FIG. 13 shows that while the circuit boards 1 are being tested in the test modules 4, which may take e.g. about 30–40 seconds, circuit boards 1 are simultaneously delivered from the elevator plane conveyors 10 of the receiving elevator 9 onto the second line conveyor 8, so that, when moving downward, the receiving elevator 9 stops each time a second elevator plane conveyor 10 is at the level of the second line conveyor 8, thus allowing the circuit board 1 to be moved onto the second line conveyor 8. At the same time, the feed elevator 6 goes down and gets a new batch of five circuit boards 1 ready for testing as described above. The lengths of time required for moving the feeding and receiving elevators up and down can easily be fitted to be considerably shorter than the duration of the testing (test time) of the circuit boards in the test modules, so that the traveling times of the elevators will not form a bottleneck retarding production. In the example embodiment, the test time is about 30–40 seconds while the time required for moving a batch of five circuit boards is about 10–15 seconds, i.e. about 2–3 seconds/circuit board.

FIG. 14 presents a further embodiment of the testing cell TC, comprising two sets of test modules side by side, a first set I of test modules 4 placed one above the other and a second set II of test modules 4' placed one above the other. The test modules in the second set II perform a different test on the circuit boards than the test modules 4 in the first set I. Test modules 4' comprise a horizontal module conveyor 5' for moving a circuit board into the test module 4' from its input side and for moving it out of the test module 4' to the opposite or exit side of the module. The test modules 4' of the second set II are disposed in a superposed array in relation to each other adjacently to the test modules of the first set I so that their module conveyors 5, 5' are mutually in alignment in immediate vicinity of each other. The system is so implemented that the circuit boards 1 move simultaneously from the module conveyors 5 of the test modules 4 of the first set I directly onto the module conveyors 5' of the test modules 4' of the second set II. Although in this example only two adjacent sets of test modules are presented, it is obvious that in the framework of the invention the number of adjacent sets of test modules is not limited but that more than two sets may be provided.

The invention is not restricted to the examples of its embodiments described above; instead, many variations are possible within the inventive idea defined in the claims.

What is claimed is:

1. Testing system for automatic testing of circuit boards (1) in a circuit board manufacturing line, said testing system comprising a testing apparatus (2) for performing testing operations on the circuit board, said manufacturing line comprising a first line conveyor (3) for feeding circuit boards horizontally in succession as a file into the testing apparatus, characterized in that the system comprises a set (I) of test modules (4) comprising a testing apparatus, each one of said test modules comprising a horizontal module conveyor (5) for conveying a circuit board (1) into and out of the test module, said teat modules being arranged in a superposed relation with respect to each other, and a feed device (6) fitted to receive and arrange a number of circuit boards from a first line conveyor (3) into a superposed relation with respect to each other so that the circuit boards (1) lie at a distance from each other corresponding to the distance between the module conveyors (5) and to feed the circuit boards substantially simultaneously into the test modules (4).

2. System as defined in claim 1, wherein that the circuit boards (1) conveyed on the circuit board manufacturing line are mutually identical; and that the test modules (4 or 4') in one test module set I or II) are mutually identical, performing an identical test on all circuit boards.

3. System as defined in claim 1, wherein that the circuit boards (1) conveyed on the circuit board manufacturing line include different circuit board types requiring different testing; and that the same set (I or II) comprises test modules (4 or 4') designed to carry out different tests corresponding to the circuit board type.

4. System as defined in claim 1, the test module (4, 4') comprises a cassette-like frame box (13), inside which the module conveyor (5) and the testing apparatus are mounted, said frame box comprising a back wall (14) provided with rear connectors (15) for the supply of electricity or the like and/or for the transfer of control data; and that the mounting frame (11) is provided with counter-connectors (16) so fitted that the rear connectors and the counter-connectors are coupled when the test module is being mounted in the mounting frame.

5. System as de fined in claim 1, wherein that the feed device (6) is a feed elevator (6) movable in a vertical direction and comprising a number of horizontal first elevator plane conveyers (7) disposed one above the other at a distance from each other corresponding to the distance between the module conveyers (5).

6. System as defined in claim 5, wherein that the feed elevator (6) has been fitted to bring the first elevator plane conveyers (7) vertically in successive order into alignment with the first line conveyor to receive one circuit board (1) at a time from the first line conveyor (3) onto each first elevator plane conveyor (7), to bring the first elevator plane conveyers (7) simultaneously into alignment with the module conveyers (5) and to feed the circuit boards (1) simultaneously from the first elevator plane conveyers (7) onto the module conveyers (5) in preparation for simultaneous testing to be carried out in the test modules (4).

7. System as defined in claim 5, wherein that the feed elevator (6) and/or the receiving elevator (9) comprises a vertical guide rail (19) fixed to the mounting frame (11); a hoisting slide (20) arranged to be movable along the guide rail, the elevator plane conveyers (7, 10) being connected to said hoisting slide one above the other at a fixed distance from each other; and a positioning actuator (21) for moving and positioning the hoisting slide.

8. System as defined in claim 1, wherein that the manufacturing line comprises a second line conveyor (8), whose conveying direction is the same as the conveying direction of the first line conveyor (3) and which, as seen in the conveying direction, is disposed after the testing apparatus (2) to receive the circuit boards from the testing apparatus and to convoy them horizontally in succession as a file; and that the system comprises a receiving device (9) disposed on the opposite side of the test modules in relation to the feed device (6), said receiving device (9) being fitted to simultaneously receive from the test modules a number of circuit boards (1) in a superposed relation with respect to each other so that the circuit boards (1) lie at a distance from each other corresponding to the distance between the module conveyors (5) and to feed the circuit boards onto the second line conveyor (8) so that they form a successive file on it.

9. System as defined in claim 8, wherein that the receiving device (9) is a vertically movable receiving elevator (9) comprising a number of horizontal second elevator plane conveyors (10) disposed one above the other at a distance from each other corresponding to the distance between the module conveyors (5).

10. System as defined in claim 9, wherein that the receiving elevator (9) has been fitted to receive the circuit boards (1) simultaneously from the module conveyors (6), to bring the second elevator plane conveyors (10) in successive order into alignment with the second line conveyor (8) to permit the circuit boards to be moved one at a time from each second elevator plane conveyor (10) onto the second line conveyor (8) so that they form a successive file on it.

11. System as defined in claim 8, wherein that the system comprises a second set (II) of test modules (4') comprising a testing apparatus and disposed beside the first set (I) of test modules to perform a test on the circuit boards that differs from the test performed by the test modules (4) of the first set (I).

12. System as defined in claim 11, wherein that each test module (4') in the second set (II) comprises a horizontal module conveyor (5') for moving a circuit board into and out of the test module, and which test modules (4') of the second set (II) are disposed in a superposed relation to each other and adjacently to the test modules of the first set (I) so that their module conveyors (5, 5') are in alignment with each other in immediate vicinity of each other; and that the system is so implemented that the circuit boards (1) are moved simultaneously from the module conveyors (5) of the test modules (4) of the first set (I) onto he module conveyors (5') of the test modules (4') of the second set (II).

13. System as defined in claim 8, wherein that the feed device (6), the test modules (4, 4') and the receiving device (9) have been assembled into a single unit built in a common mounting frame (11) to form a testing cell (TC) which can be incorporated in a modular manufacturing line consisting of different cells.

14. System as defined in claim 13, wherein that the mounting frame (11) comprises guide supporters (12) placed at a vertical distance from each other to support the test modules (4, 4') one above the other and allowing the test module supported by said guide supporters to be removed from and inserted into the mounting frame by a horizontal movement.

15. System as defined in claim 1, wherein that the test modules (4, 4') are disposed above the level of the line conveyors (3, 8).

16. System as defined in claim 15, wherein that the system comprises a horizontal transit conveyor (17) disposed below the lowest test module (4, 4') in the test module set (I, II), in alignment with the line conveyors (3, 8), for conveying circuit boards through the testing system without having them tested.

17. System as defined in claim 15, wherein that the mounting frame (11) comprises a control gear space (18) disposed below the test modules (4, 4') to accommodate control devices used to control the test modules and the feeding and receiving elevators (6, 9).

* * * * *